United States Patent
Wang

(10) Patent No.: US 8,506,058 B2
(45) Date of Patent: Aug. 13, 2013

(54) LIQUID EJECTING HEAD, LIQUID EJECTING APPARATUS, AND PIEZOELECTRIC ELEMENT

(75) Inventor: Xiaoxing Wang, Chino (JP)

(73) Assignee: Seiko Epson Corporation, Tokyo (JP)

( * ) Notice: Subject to any disclaimer, the term of this patent is extended or adjusted under 35 U.S.C. 154(b) by 208 days.

(21) Appl. No.: 12/879,597

(22) Filed: Sep. 10, 2010

(65) Prior Publication Data

US 2011/0063379 A1  Mar. 17, 2011

(30) Foreign Application Priority Data

Sep. 15, 2009 (JP) ................. 2009-213782
Mar. 12, 2010 (JP) ................. 2010-056802

(51) Int. Cl.
*B41J 2/045* (2006.01)
*H01L 41/18* (2006.01)

(52) U.S. Cl.
USPC ............................................ 347/71; 310/365

(58) Field of Classification Search
USPC   347/68, 70–72; 310/311, 365; 252/62.9 PZ, 252/62.9 R
See application file for complete search history.

(56) References Cited

U.S. PATENT DOCUMENTS

| 6,984,843 | B2 * | 1/2006 | Higuchi et al. ................. 257/16 |
| 7,740,345 | B2 | 6/2010 | Takabe et al. |
| 2007/0287625 | A1 * | 12/2007 | Yanagida et al. .............. 501/138 |

FOREIGN PATENT DOCUMENTS

| CN | 101049758 A | 10/2007 |
| EP | 1708211 | 10/2006 |
| EP | 1868218 | 12/2007 |
| JP | 06-279110 | 10/1994 |
| JP | 2000-072539 | 3/2000 |
| JP | 2001-223404 | 8/2001 |
| JP | 2003-128460 | 5/2003 |
| WO | 2007/113280 | 10/2007 |
| WO | 2009/037922 | 3/2009 |

OTHER PUBLICATIONS

Xusheng Wang, et al "Large electrostriction near the solubility limit in BaTiO3-CaTiO3 ceramics" Applied Physics Letters 86, 022905 (2005).

Qihua Yang, et al "Structural, electrical, luminescent, and magnetic properties of Ba0.77Ca0.23Tio3:Eu ceramics" Materials Chemistry and Physics, 118 (2009) 484-489.

T. Mazon, et al "Structural and dielectric properties of Nd3+-doped Ba0.77Ca0.23TiO3 ceramics" Journal of Applied Physics 97, 104113 (2005).

* cited by examiner

*Primary Examiner* — Lisa M Solomon
(74) *Attorney, Agent, or Firm* — Workman Nydegger

(57) ABSTRACT

A liquid ejecting head includes a pressure generating chamber communicating with a nozzle for ejecting liquid droplets and a piezoelectric element having a piezoelectric layer and a pair of electrodes disposed on both sides of the piezoelectric layer. The piezoelectric layer is made of a perovskite-type oxide containing barium titanate, calcium titanate, and europium oxide.

10 Claims, 12 Drawing Sheets

LIQUID EJECTING HEAD, LIQUID EJECTING APPARATUS, AND PIEZOELECTRIC ELEMENT

The entire disclosure of Japanese Patent Application Nos. 2009-213782, filed Sep. 15, 2009 and 2010-056802, filed Mar. 12, 2010 are expressly incorporated herein by reference.

BACKGROUND OF THE INVENTION

1. Technical Field

The present invention relates to a liquid ejecting head, a liquid ejecting apparatus including the head, and a piezoelectric element. More specifically, the present invention relates to a piezoelectric element which may be used in a liquid ejecting head and apparatus with improved displacement and discharging properties.

2. Related Art

One example of a liquid ejecting head currently known in the art is a ink jet recording head. In such ink jet recording heads, a diaphragm constitutes a part of a pressure-generating chamber that communicates with a nozzle orifice for discharging ink drops, and a piezoelectric element deforms the diaphragm to pressurize ink in the pressure-generating chamber in order to discharge ink droplets through the nozzle orifice. In some of piezoelectric elements used in the ink jet recording heads, a piezoelectric layer made of a piezoelectric material exhibiting an electromechanical transducing function, such as piezoelectric ceramics, is disposed between two electrodes. Such a piezoelectric element is mounted on a liquid ejecting head as a flexure-vibration-mode actuator.

In some liquid ejecting heads, lead zirconate titanate (PZT) having high displacement characteristics is used as piezoelectric ceramics (see JP-A-2001-223404). One problem with these configurations, however, is that the lead results in environmental pollution. As such, there has been an increased demand for piezoelectric ceramics and liquid ejecting heads with a reduced amount of lead and other harmful substances. For example, as piezoelectric ceramics not containing lead, $BaTiO_3$ having a perovskite structure represented by $ABO_3$ is known (for example, see JP-A-2000-72539).

However, the piezoelectric property of $BaTiO_3$ is not sufficient for use as the piezoelectric element of a liquid ejecting head, and therefore a further improvement has been needed. Accordingly, for example, it is proposed to improve withstand-voltage characteristics by adding calcium titanate ($CaTiO_3$) to barium titanate ($BaTiO_3$), such as described in JP-A-6-279110.

However, even when piezoelectric ceramics of $BaTiO_3$ to which $CaTiO_3$ is added are used in piezoelectric elements, since the displacement characteristics are insufficient, there is a problem that ink jet recording heads cannot be provided with sufficient ejection characteristics.

BRIEF SUMMARY OF THE INVENTION

An advantage of some aspects of the invention is to provide a piezoelectric element that has a reduced environmental load and also high displacement characteristics, in addition to a liquid ejecting head and a liquid ejecting apparatus having the liquid ejecting head.

A first aspect of the invention is a liquid ejecting head including a pressure generating chamber that communicates with a nozzle for ejecting liquid droplets and a piezoelectric element having a piezoelectric layer and a pair of electrodes disposed on both surfaces of the piezoelectric layer, wherein the piezoelectric layer is made of a perovskite-type oxide containing barium titanate, calcium titanate, and europium oxide. In the liquid ejecting head of the invention, since the piezoelectric layer includes barium titanate, calcium titanate, and europium oxide, the environmental load is small, and the displacement characteristics are high. Therefore, the liquid ejecting head can be provided with sufficient ejection characteristics.

Another aspect of the invention is a liquid ejecting apparatus which includes the liquid ejecting head. Since the liquid ejecting apparatus has the liquid ejecting head including the piezoelectric element that has a reduced environmental load and also high displacement characteristics, the liquid ejecting apparatus can be reduced in environmental load and provided with high liquid ejection performance.

A third aspect of the invention is a piezoelectric element which includes a piezoelectric layer and a pair of electrodes disposed on both surfaces of the piezoelectric layer. The piezoelectric layer is made of a perovskite-type oxide containing barium titanate, calcium titanate, and europium oxide. The piezoelectric layer including barium titanate, calcium titanate, and europium oxide has a small environmental load and high displacement characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiment 1

Figure 1:
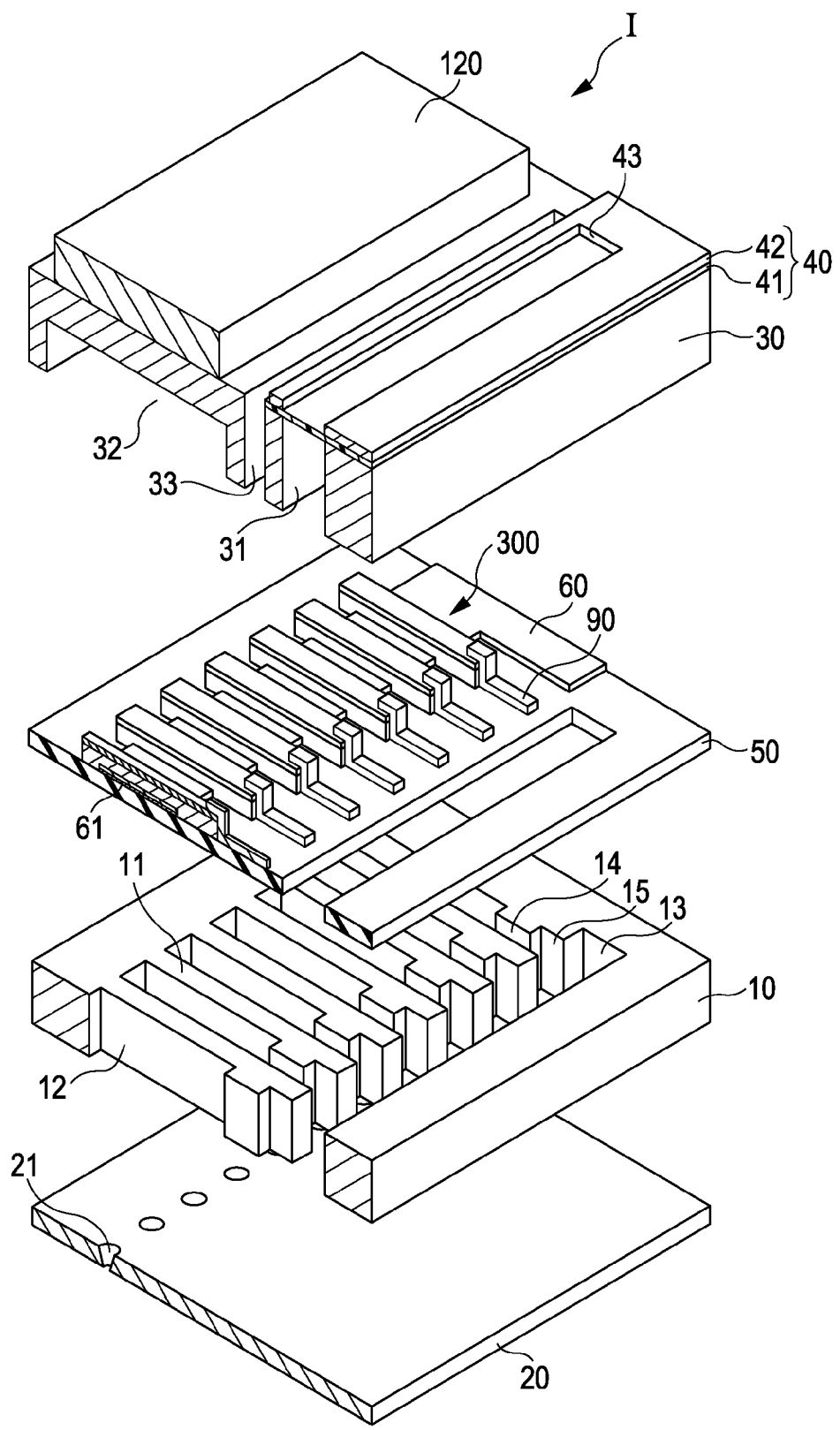
FIG. 1 is an exploded perspective view of a recording head according to a first embodiment.
Figure 2A:
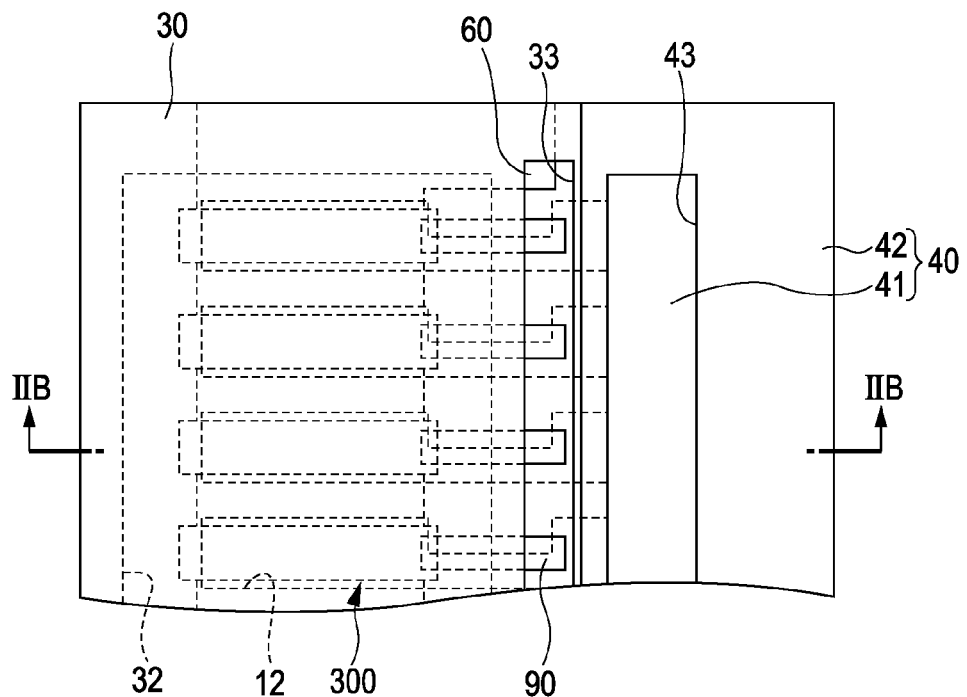
FIG. 2A is a plan view of the recording head according to the first embodiment.
Figure 2B:
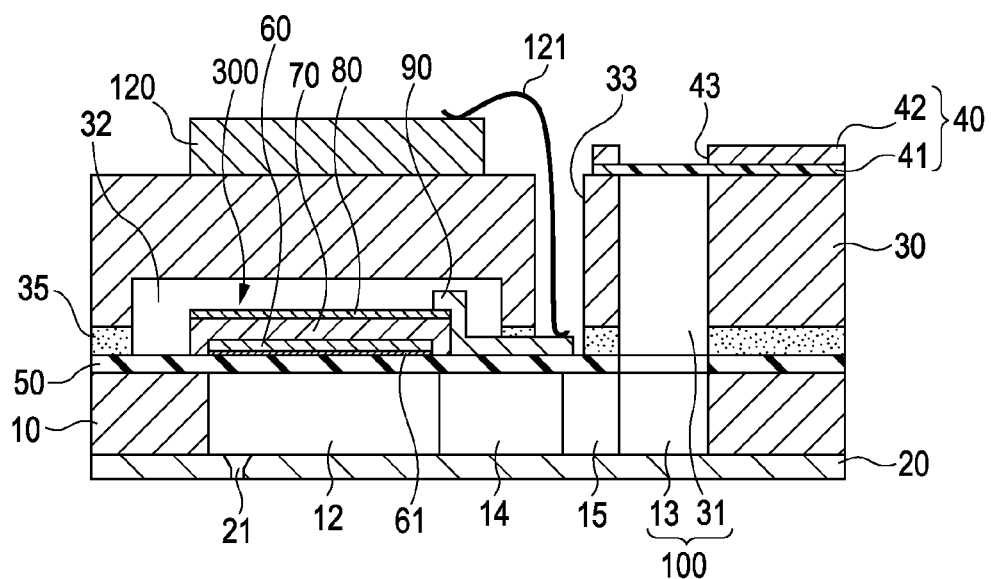
FIG. 2B is a cross-sectional view of the recording head according to the first embodiment.

FIG. 1 is an exploded perspective view schematically showing a constitution of an ink jet recoding head as an example of the liquid ejecting head according to Embodiment 1 of the invention, and FIG. 2A is a plan view of the ink jet recoding head, and FIG. 2B is a cross-sectional view taken along the line IIB-IIB of the plan view.

As shown in FIGS. 1, 2A, and 2B, an elastic film 50 is disposed on one surface of a flow path-forming substrate 10 of the Embodiment 1, which is a first embodiment of the invention. The flow path-forming substrate 10 is made of, for example, a single-crystal silicon substrate having a crystal face preferentially oriented along (111) plane. In this description, the term "preferentially oriented along (111) plane" includes a case that all crystals are oriented along (111) plane and a case that most crystals (for example, 90% or more) are oriented along (111) plane. The elastic film 50 is made of, for example, silicon oxide. Incidentally, the single-crystal silicon substrate in the first embodiment is preferentially oriented along (111) plane, but is not limited thereto.

The flow path-forming substrate 10 is provided with a plurality of pressure generating chambers 12 arranged in parallel in its width direction. Furthermore, the flow path-forming substrate 10 is provided with a communicating portion 13 in an area on an outer side in the longitudinal direction of the pressure generating chambers 12, and the communicating portion 13 and each pressure generating chamber 12 are communicated with each other through an ink-supplying path 14 and a communicating path 15 provided to each of the pressure generating chambers 12. The communicating portion 13 communicates with a reservoir portion 31 of a protective substrate described more fully below to constitute a part of a reservoir 100 serving as an ink chamber common to all the pressure generating chambers 12. The ink-supplying path 14 has a width which is narrower than that of the pressure generating chamber 12. The ink-supplying path 14 maintains a constant flow path resistance of ink flowing in the pressure generating chamber 12 from the communicating portion 13. Incidentally, in Embodiment 1, the ink-supplying path 14 is formed by narrowing the width of the flow path from one side, but it may be formed by narrowing the width of the flow path from both sides. Alternatively, the ink-supplying path may be formed by narrowing the flow path from the thickness direction, instead of narrowing the width of the flow path.

In addition, the flow path-forming substrate 10 is bonded to a nozzle plate 20 with, for example, an adhesive or a thermal adhesive film on the opening surface side. The nozzle plate 20 is perforated with nozzle orifices 21 that communicate with the corresponding pressure-generating chambers 12 in the vicinity of the ends of the pressure-generating chambers 12 on the side opposite to the ink-supplying path 14. The nozzle plate 20 is made of, for example, glass ceramics, a single-crystal silicon substrate, or stainless steel.

Furthermore, as described above, the elastic film 50 is disposed on the opposite side of the flow path-forming substrate 10 from the opening surface. A piezoelectric layer 70 that is a thin film having a thickness of 10 μm or less, preferably 0.3 to 1.5 μm, and a second electrode 80 are laminated on the elastic film 50 to constitute a piezoelectric element 300. The first electrode 60 and the second electrode 80 are made of, for example, platinum (Pt) and are preferentially oriented along (111) plane. Furthermore, an adhesive layer 61 is disposed between the first electrode 60 and the elastic film 50. The adhesive layer 61 is not particularly limited as long as it can improve the adhesive force between the lower electrode film 60 and the elastic film 50, and examples thereof are those having a thickness of 10 to 50 nm and containing, as a main component, at least one selected from the group consisting of titanium (Ti), chromium (Cr), tantalum (Ta), zirconium (Zr), and tungsten (W). By thus providing the adhesive layer 61 between the first electrode 60 and the elastic film 50, the adhesive force between the elastic film 50 and the first electrode 60 can be increased.

In this specification, the piezoelectric element 300 is a component including the first electrode 60, the piezoelectric layer 70, and the second electrode 80. In general, one of the electrodes of each piezoelectric element 300 is formed as a common electrode, and the other electrode and the piezoelectric layer 70 are formed by patterning for each pressure-generating chamber 12. In Embodiment 1, the first electrode 60 is the common electrode of the piezoelectric elements 300, and the second electrode 80 is the individual electrode of each piezoelectric element 300, but these may be reversed depending on a driving circuit or wiring. Furthermore, the piezoelectric element 300 disposed so as to be displaceable is referred to as an actuator.

The piezoelectric layer 70 disposed on the first electrode 60 is a perovskite-type oxide containing barium titanate (for example, $BaTiO_3$), calcium titanate (for example, $CaTiO_3$) and europium oxide (for example, $Eu_2O_3$). Specifically, the piezoelectric layer 70 contains barium titanate as a main component (for example, 90% or more of the entire piezoelectric layer 70) and further contains calcium titanate and europium oxide (for example, 2 to 10% and 0.1 to 5%, respectively, of the entire piezoelectric layer 70).

In Embodiment 1, since the piezoelectric layer 70 thus contains barium titanate, calcium titanate, and europium oxide, the piezoelectric element 300 has high withstand-voltage characteristics and also high displacement characteristics. As a result, the ink jet recoding head I can be applied to practical use as described below.

Known lead-free piezoelectric ceramics in which calcium titanate are added to barium titanate have high withstand-voltage characteristics but low displacement characteristics and, therefore, cannot be used as the piezoelectric layer of a piezoelectric element that is mounted on an ink jet recoding head. However, in Embodiment 1, not only calcium titanate but also europium oxide is added to barium titanate. By thus further containing europium oxide, the displacement characteristics are improved. In addition, temperature characteristics and durability are satisfactory. In this regard, the details will be described in experimental examples described below.

Furthermore, it is preferable that the piezoelectric layer 70 further contain zirconium oxide (for example, $ZrO_2$). By thus containing zirconium oxide, the displacement characteristics are further improved.

It is preferable that the piezoelectric layer 70 contain, for example, barium titanate, calcium titanate, europium oxide, and zirconium oxide in a weight ratio of 0.93 to 0.95:0.05 to 0.07:0.005 to 0.01:0.005 to 0.01, which is represented by the following formula (1):

$$x[BaTiO_3]\text{-}(1-x)[CaTiO_3]\text{-}y[Eu_2O_3]\text{-}z[ZrO_2] \qquad (1)$$

(wherein, $0.93 \leq x \leq 0.95$, $0.005 \leq y \leq 0.01$, $0.005 \leq z \leq 0.01$). Note that when zirconium oxide is not contained, z is zero in the formula (1).

Incidentally, the perovskite-type oxide is a compound having a perovskite structure. In the perovskite structure, that is, in the $ABO_3$ structure, twelve oxygen atoms are coordinated to the A-site, and six oxygen atoms are coordinated to the B-site to form an octahedron; and Ba, Ca, and Eu are located at the A-site, and Ti and, according to need, Zr are located at the B-site.

In the invention, by adding small amounts of europium oxide and zirconium oxide to barium titanate serving as the main component, Eu is located at the A-site where Ba is located, and Zr is located at the B-site where Ti is located. Since the ionic radii of Ba and Eu are 149 pm and 95 pm, respectively, Ba and Eu are largely different in their ionic radii. Similarly, the ionic radii of Ti and Zr are 75 pm and 86 pm, respectively, Ti and Zr are largely different in their ionic radii. Therefore, it is assumed that the crystal lattice is deformed by that Eu and Zr are respectively located at the A-site and the B-site of the crystal lattice, and thereby a domain easily rotates, resulting in an improvement in the piezoelectric property (displacement characteristics).

The second electrode 80 serving as the individual electrode of the piezoelectric element 300 is connected to a lead electrode 90 made of, for example, gold (Au) that is drawn out from the vicinity of the end on the ink-supplying path 14 side of the second electrode 80 and extends on the elastic film 50.

Above the flow path-forming substrate 10 thus provided with piezoelectric elements 300, a protective substrate 30 is provided. That is, the protective substrate 30 is bonded to the first electrode 60, the elastic film 50, and the lead electrodes 90 with an adhesive 35. The protective substrate 30 has the reservoir portion 31 constituting at least a part of the reservoir 100. In Embodiment 1, the reservoir portion 31 is formed along the width direction of the pressure generating chambers 12 so as to pass through the protective substrate 30 in the thickness direction and communicates with the communicating portion 13 of the flow path-forming substrate 10 to constitute the reservoir 100 serving as a common ink chamber for the pressure generating chambers 12, as described above. Alternatively, the communicating portion 13 of the flow path-forming substrate 10 may be divided so as to correspond to each pressure generating chamber 12, and only the reservoir portion 31 may serve as the reservoir 100. Furthermore, for example, the flow path-forming substrate 10 may be provided with only the pressure generating chambers 12, and members (for example, the elastic film 50) interposed between the flow path-forming substrate 10 and the protective substrate 30 may be provided with the reservoir 100 and the ink-supplying paths 14 communicating with the corresponding pressure generating chambers 12.

The protective substrate 30 is provided with a piezoelectric element holding portion 32 at an area facing the piezoelectric elements 300. The piezoelectric element holding portion 32 has a space that is enough not to prevent the movement of the piezoelectric elements 300. The space of the piezoelectric element holding portion 32 may be sealed or not be sealed as long as it is enough not to prevent the movement of the piezoelectric elements 300.

The protective substrate 30 is preferably made of a material having almost the same coefficient of thermal expansion as that of the flow path-forming substrate 10, for example, glass or a ceramic material. In Embodiment 1, the protective substrate 30 is a single-crystal silicon substrate, which is the same material as that of the flow path-forming substrate 10.

The protective substrate 30 is provided with a through-hole 33 passing through the protective substrate 30 in the thickness direction. The through-hole 33 is formed so that the vicinity of the end of the lead electrode 90 drawn out from each piezoelectric element 300 is exposed in the through-hole 33.

Furthermore, a driving circuit 120 for driving the piezoelectric elements 300 arranged in parallel is fixed on the protective substrate 30. The driving circuit 120 may be, for example, a circuit board or a semiconductor integrated circuit (IC). The driving circuit 120 and the lead electrodes 90 are electrically connected to each other through connecting wire 121 composed of conductive wire such as bonding wire.

In addition, a compliance substrate 40 including a sealing film 41 and a fixing plate 42 is bonded on the protective substrate 30. Here, the sealing film 41 is formed of a flexible material having a low rigidity and seals one side of the reservoir portion 31. The fixing plate 42 is formed of a relatively hard material. The fixing plate 42 is provided with an opening 43 at an area corresponding to the reservoir 100 by completely removing the fixing plate 42 in the thickness direction. Therefore, one side of the reservoir 100 is sealed with only the flexible sealing film 41.

In such an ink jet recoding head of Embodiment 1, ink is fed through an ink inlet being connected to exterior ink supplying means (not shown) to fill the inside from the reservoir 100 to the nozzle orifices 21 with ink. Then, a voltage is applied between the first electrode 60 and the second electrode 80 corresponding to each pressure generating chamber 12 according to a recording signal received from the driving circuit 120. The voltage causes the elastic film 50 to flex and deform, along with the first electrode 60, and the piezoelectric layer 70. Thereby, the pressure in each pressure generating chamber 12 is increased, and ink droplets are discharged from the nozzle orifices 21.

A process of producing the ink jet recoding head of Embodiment 1 will be described with reference to FIGS. 3A to 3C, 4A to 4C, and 5A to 5C, which are cross-sectional views showing the process of producing the ink jet recording head of Embodiment 1.

Figure 3A:
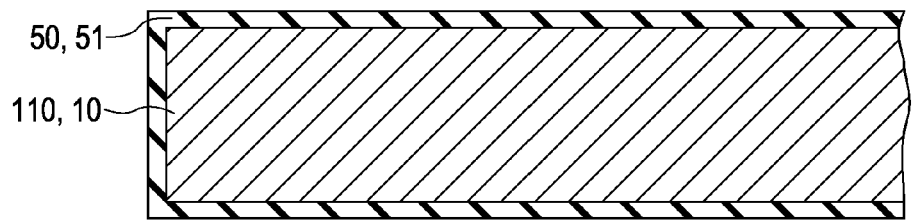
FIG. 3A is a schematic cross-sectional view of a main portion showing a process of producing the recording head according to the first embodiment.

First, as shown in FIG. 3A, an oxide film 51 constituting the elastic film 50 is formed on a surface of a flow path-forming substrate wafer 110 of a silicon wafer that forms a plurality of flow path-forming substrates 10 in a unified manner. The method for forming the oxide film 51 is not particularly limited. In Embodiment 1, the flow path-forming substrate wafer 110 is thermally oxidized to form a silicon dioxide film 51 serving as the elastic film 50 on the surface thereof.

Figure 3B:
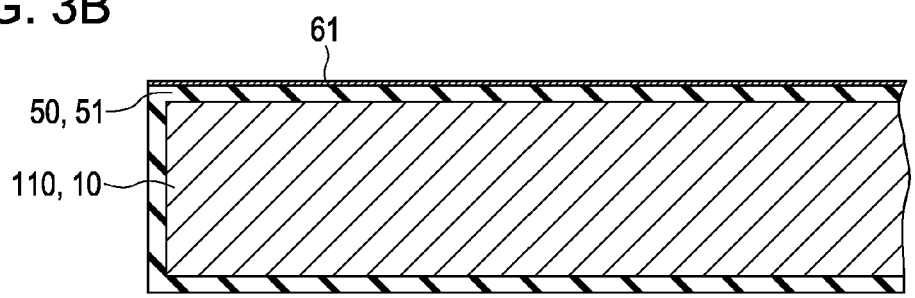
FIG. 3B is a schematic cross-sectional view of the main portion showing the process of producing the recording head according to the first embodiment.

Then, as shown in FIG. 3B, an adhesive layer 61 is formed on the oxide film 51. The adhesive layer 61 may be formed by any method without particular limitation, but can be formed by, for example, sputtering or chemical vapor deposition (CVD).

Figure 3C:
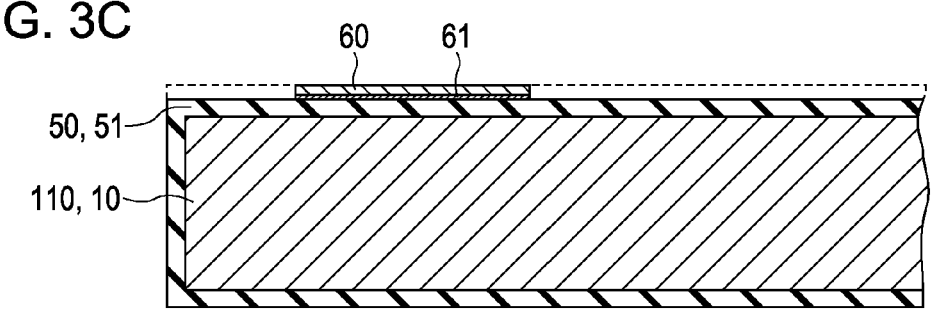
FIG. 3C is a schematic cross-sectional view of the main portion showing the process of producing the recording head according to the first embodiment.

Then, as shown in FIG. 3C, a first electrode 60 made of platinum (Pt) and having a thickness of 50 to 500 nm is formed on the adhesive layer 61. The first electrode 60 and the adhesive layer 61 are patterned into a predetermined shape. The first electrode 60 may be formed by any method without particular limitation, but can be formed by, for example, sputtering or CVD. In Embodiment 1, the first electrode 60 is formed by sputtering. Examples of the patterning include dry etching such as reactive ion etching and ion milling.

Figure 4A:
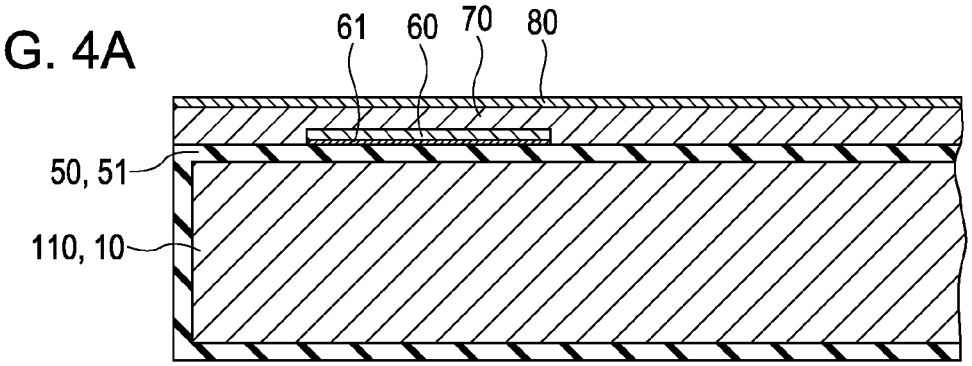
FIG. 4A is a schematic cross-sectional view of the main portion showing the process of producing the recording head according to the first embodiment.

Then, as shown in FIG. 4A, a piezoelectric layer 70 is formed which contains barium titanate as a main component and further containing calcium titanate, europium oxide, and, according to need, zirconium oxide. The piezoelectric layer 70 is formed by, for example, a sol-gel method, metal organic decomposition (MOD), or sputtering. In Embodiment 1, the piezoelectric layer 70 is formed by the sol-gel method. Occurrence of cracking in the piezoelectric layer 70 can be prevented by forming the piezoelectric layer 70 by the sol-gel method using sol of Embodiment 1, as described below, and also the cost can be reduced.

An example of the sol (solution) used in the sol-gel method of Embodiment 1 will be described below. In the sol of Embodiment 1, $CaTiO_3$ sol, $Eu_2O_3$ sol, and, according to need, $ZrO_2$ sol are added to $BaTiO_3$ sol, and a fine powder composed of $BaTiO_3$ having an average particle size of 10 to 100 nm is further added thereto. A high concentration of $BaTiO_3$ in the sol can be obtained by adding powdery $BaTiO_3$ to sol containing metal organic compounds that are usually used for forming the piezoelectric layer 70. By doing so, the solid content is increased, a thick film can be formed, and also the sol hardly shrinks during firing. As a result, stress is reduced to prevent cracking from occurring. That is, there has been a problem that cracking tends to occur in $BaTiO_3$ thin films, but in Embodiment 1, occurrence of cracking can be effectively prevented by adding a powder to the sol. As such a $BaTiO_3$ powder, for example, BT01, a product of Sakai Chemical Industry Co., Ltd., can be used.

Furthermore, the sol that is used in Embodiment 1 preferably contains at least one selected from potassium (K) and silicon (Si) for reducing crystallization temperature. That is, there has been a problem that the crystallization temperature is high for forming a barium titanate-based thin film, but in Embodiment 1, the crystallization temperature can be reduced by adding at least one selected from K and Si to the sol. In this case, each of K and Si can be added in a sol state.

The method will be specifically described below. The above-mentioned sol (solution) is applied on the flow path-forming substrate 10 provided with the first electrode 60 to form a piezoelectric precursor film (application step). When the piezoelectric precursor film is a usual PZT film, the thickness is 0.5 to 1.0 µm. However, in Embodiment 1, the thickness is 1.0 to 2.0 µm, preferably 1.5 to 2.0 µm. This is because that since the solid solution content is high and cracking hardly occurs in the piezoelectric layer 70 by forming the film using the sol of Embodiment 1, the film can have a large thickness. Then, the piezoelectric precursor film is heated at a predetermined temperature for a predetermined time for drying (drying step). For example, in Embodiment 1, the drying step is conducted by keeping the film at 150 to 180° C. for 2 to 10 minutes.

Then, the dried piezoelectric precursor film is heated to a predetermined temperature and is kept at the temperature for a predetermined period of time for degreasing (degreasing step). For example, in Embodiment 1, the piezoelectric precursor film is heated to about 300 to 450° C. and is kept at the temperature for about 2 to 10 minutes for degreasing. In the specification, the term "degreasing" means that organic components contained in the piezoelectric precursor film are eliminated as, for example, $NO_2$, $CO_2$, or $H_2O$. Then, the piezoelectric precursor film is heated to a predetermined temperature with an infrared heater and is kept at the temperature for a predetermined period of time for crystallization to form a piezoelectric film (firing step).

A piezoelectric layer 70 composed of a plurality of layers of piezoelectric films is formed by repeating more than once the piezoelectric film-forming process composed of the application step, the drying step, the degreasing step, and the firing step. In Embodiment 1, since the above-mentioned sol is used, cracking hardly occur. Therefore, a thick piezoelectric precursor film can be formed. Consequently, the number of repeating times of the piezoelectric film-forming process is reduced, and the cost can be reduced.

Figure 4B:
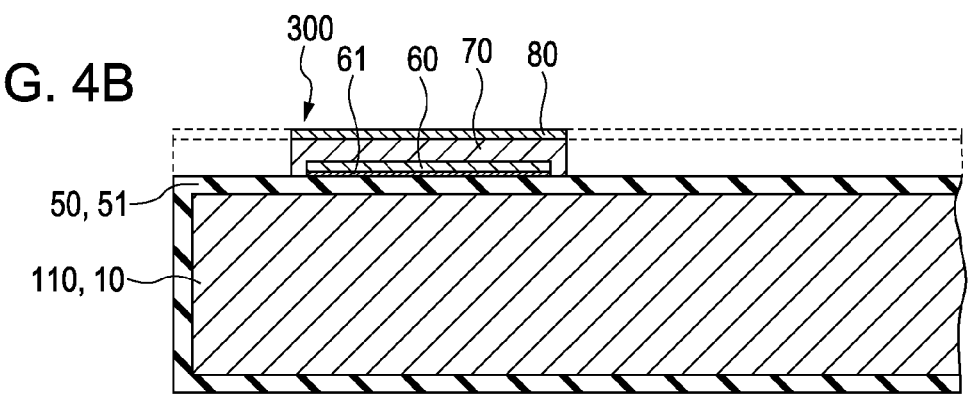
FIG. 4B is a schematic cross-sectional view of the main portion showing the process of producing the recording head according to the first embodiment.

Then, as shown in FIG. 4A, a second electrode 80 is formed on the piezoelectric layer 70. Subsequently, as shown in FIG. 4B, the piezoelectric layer 70 and the second electrode 80 are patterned in areas corresponding to the pressure generating chambers 12 to form piezoelectric elements 300. The piezoelectric layer 70 and the second electrode 80 are patterned by, for example, dry etching such as reactive ion etching or ion milling.

Figure 4C:
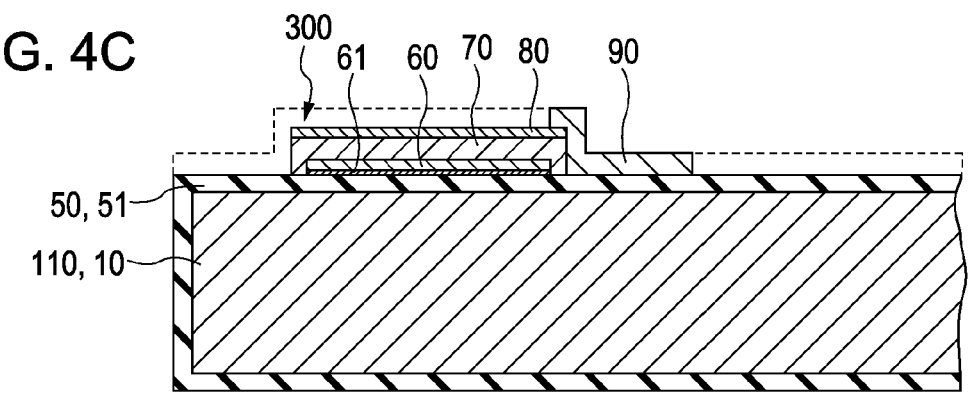
FIG. 4C is a schematic cross-sectional view of the main portion showing the process of producing the recording head according to the first embodiment.

Then, lead electrodes 90 are formed. Specifically, as shown in FIG. 4C, a layer for the lead electrodes 90 made of, for example, gold (Au) is formed on the entire surface of the flow path-forming substrate wafer 110 and then is patterned through a mask pattern (not shown) composed of resist or the like to form the lead electrodes 90 corresponding to the respective piezoelectric elements 300.

Figure 5A:
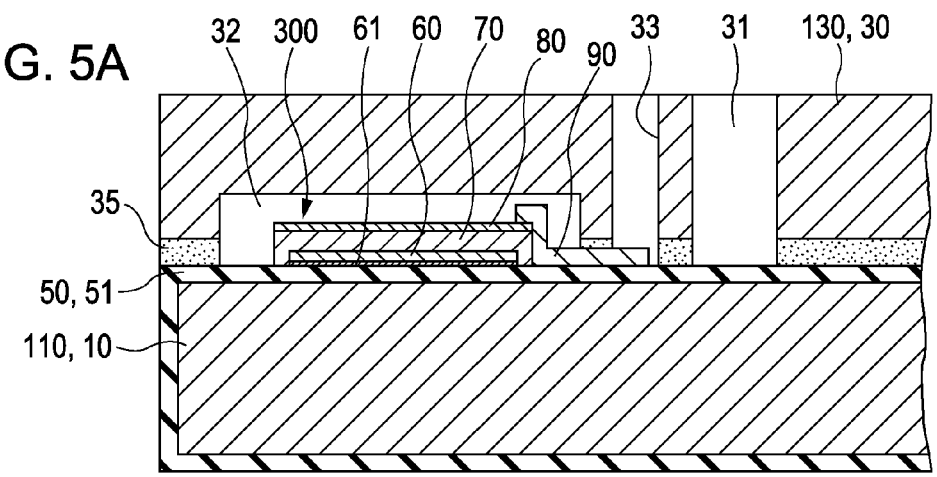
FIG. 5A is a schematic cross-sectional view of the main portion showing the process of producing the recording head according to the first embodiment.

Then, as shown in FIG. 5A, a protective substrate wafer 130 that is a silicon wafer for forming a plurality of protective substrates 30 is bonded to the flow path-forming substrate wafer 110 on the piezoelectric element 300 side with an adhesive 35.

Figure 5B:
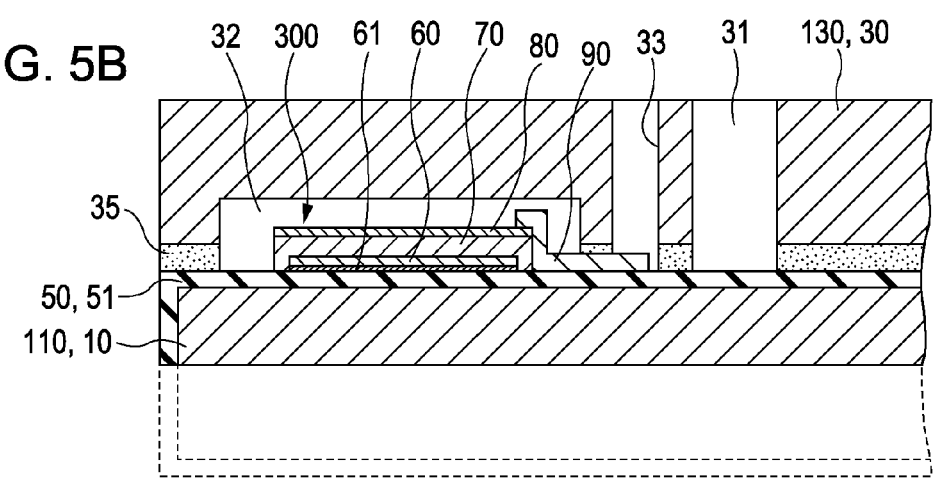
FIG. 5B is a schematic cross-sectional view of the main portion showing the process of producing the recording head according to the first embodiment.
Figure 5C:
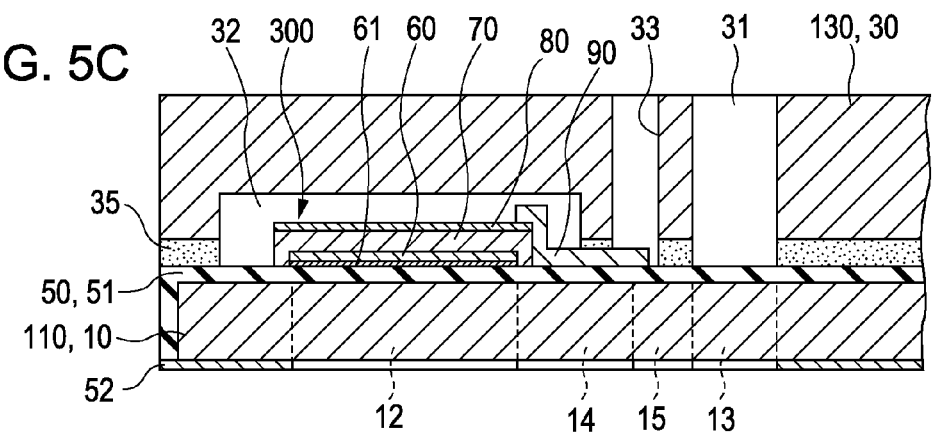
FIG. 5C is a schematic cross-sectional view of the main portion showing the process of producing the recording head according to the first embodiment.
Figure 6:
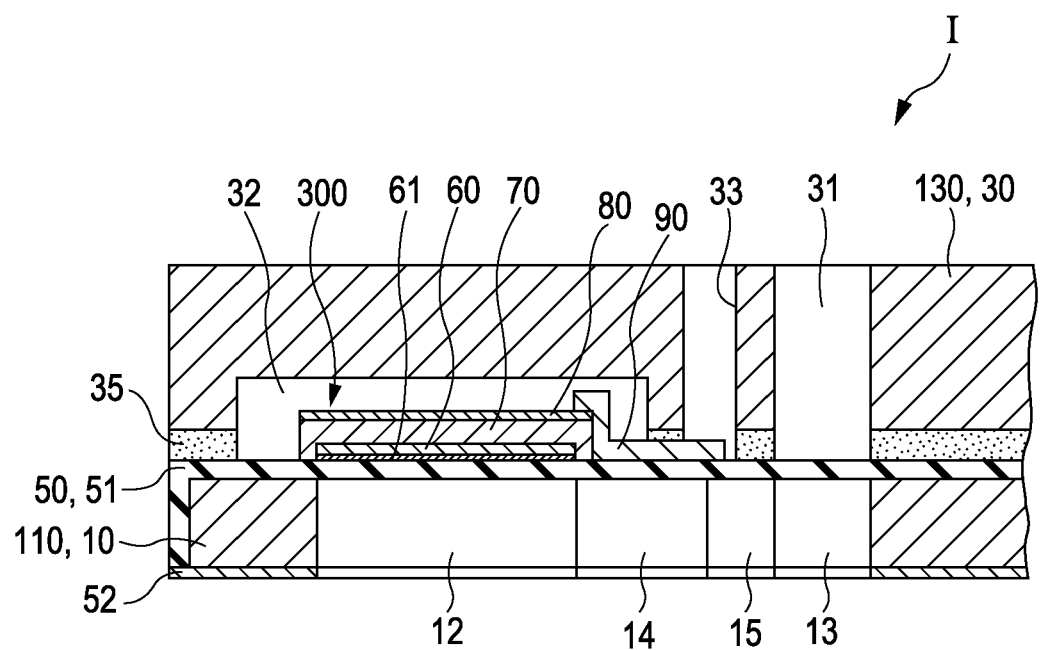
FIG. 6 is a schematic cross-sectional view of the main portion showing the process of producing the recording head according to the first embodiment.

Then, as shown in FIG. 5B, the flow path-forming substrate wafer 110 is thinned to a predetermined thickness. Subsequently, as shown in FIG. 5C, a new mask film 52 is formed on the flow path-forming substrate wafer 110 and patterned into a predetermined shape. Then, as shown in FIG. 6, the flow path-forming substrate wafer 110 is anisotropically etched (wet-etched) with an alkaline solution such as KOH through the mask film 52 to form the pressure generating chambers 12, the communicating portion 13, the ink-supplying paths 14, and the communicating paths 15 corresponding to the respective piezoelectric elements 300.

Then, unneeded portions at the outer peripheries of the flow path-forming substrate wafer 110 and the protective substrate wafer 130 are removed by cutting, e.g., by dicing. The nozzle plate 20 perforated with nozzle orifices 21 is bonded to the flow path-forming substrate wafer 110 on the side opposite to the protective substrate wafer 130. The compliance substrate 40 is bonded to the protective substrate wafer 130, and the flow path-forming substrate wafer 110 and other associated components are divided into individual chip-sized flow path-forming substrates 10 and other components as shown in FIG. 1 to give an ink jet recoding head I of the Embodiment as shown in FIG. 1.

Embodiment 2

Figure 7:
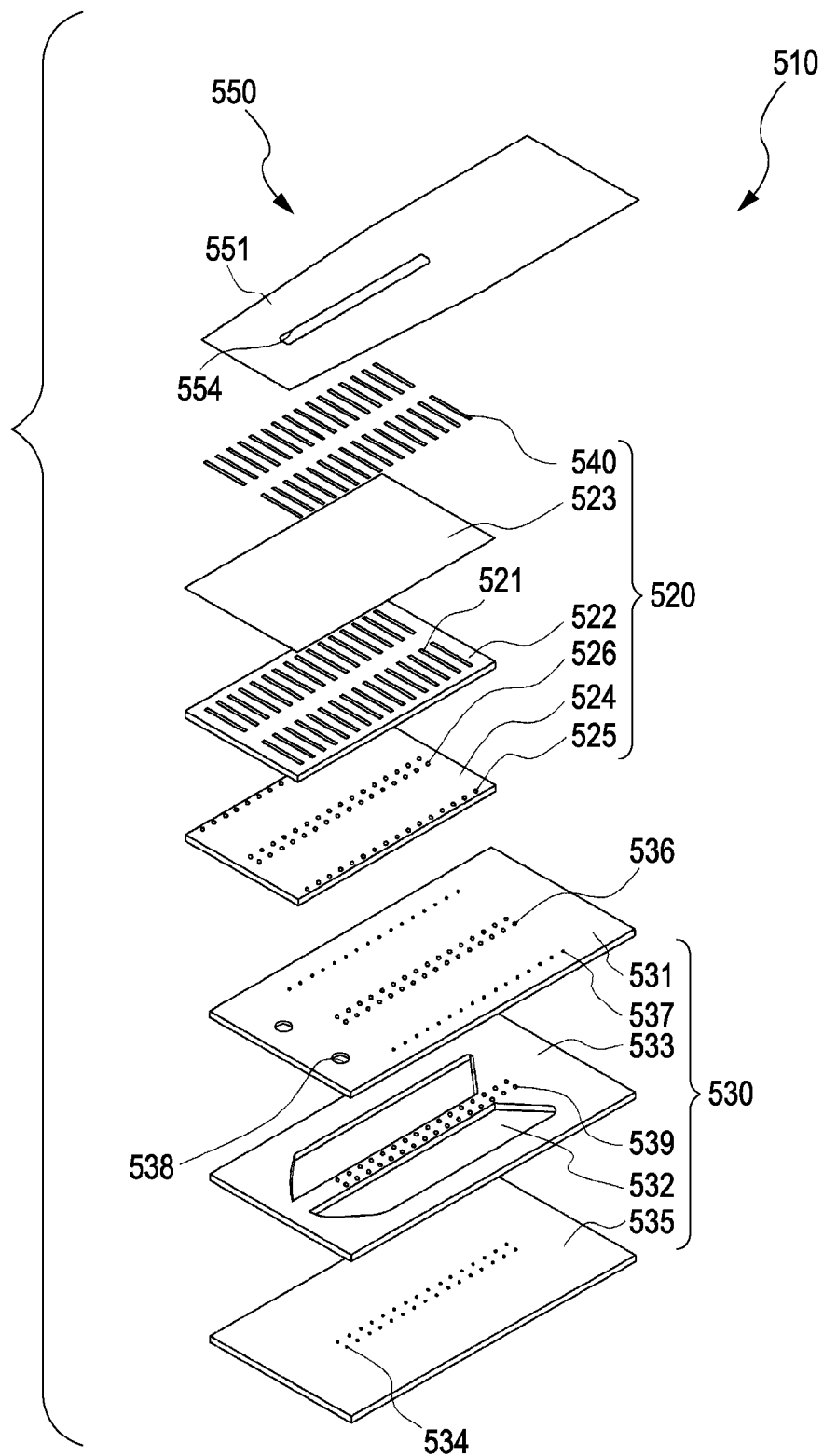
FIG. 7 is an exploded perspective view of a recording head according to a second embodiment.
Figure 8:
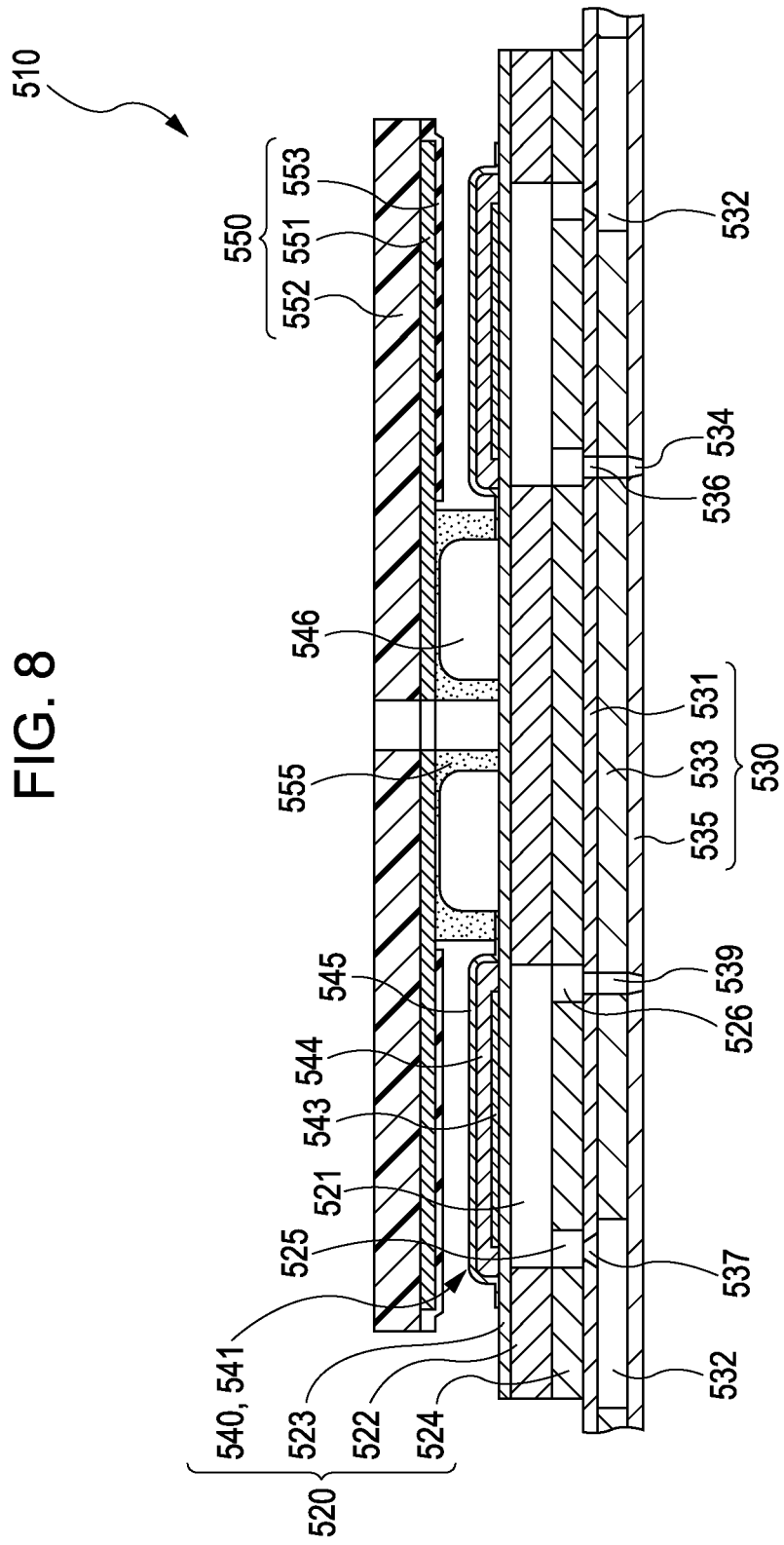
FIG. 8 is a cross-sectional view of the recording head according to a second embodiment.

FIG. 7 is an exploded perspective view schematically showing an ink jet recoding head as an example of a liquid ejecting head according to a second embodiment, or Embodiment 2, and FIG. 8 is a cross-sectional view of the ink jet recoding head.

As shown in the drawings, the ink jet recoding head 510 is constituted of an actuator unit 520, a flow path unit 530 fixed to the actuator unit 520, and a wiring board 550 connected to the actuator unit 520.

The actuator unit 520 is an actuator including piezoelectric elements 540 and includes a flow path-forming substrate 522 provided with pressure generating chambers 521, a diaphragm 523 disposed on one side of the flow path-forming substrate 522, and a pressure generating chamber bottom plate 524 disposed on the other side of the flow path-forming substrate 522.

The flow path-forming substrate 522 is, for example, a ceramic plate of alumina ($Al_2O_3$), zirconia ($ZrO_2$), or the like of about 150 μm in a thickness and is provided with a plurality of pressure generating chambers 521. In the Embodiment, two rows of the pressure generating chambers 521 arranged in parallel along the width direction thereof are formed. The diaphragm 523 is, for example, a zirconia thin plate with a thickness of 10 μm and is fixed to one side of the flow path-forming substrate 522 and seals the one side of each pressure generating chamber 521.

The pressure generating chamber bottom plate 524 is fixed to the other side of the flow path-forming substrate 522 to seal the other side of each pressure generating chamber 521. The pressure generating chamber bottom plate 524 is provided with supply-communication holes 525 and nozzle-communication holes 526. The supply-communication holes 525 are each formed in the vicinity of one end in the longitudinal direction of each pressure generating chamber 521 and communicate between the pressure generating chambers 521 and a reservoir described below. The nozzle-communication holes 526 are each formed in the vicinity of the other end in the longitudinal direction of each pressure generating chamber 521 and communicate with nozzle orifices 534 described below.

The piezoelectric elements 540 are disposed on the diaphragm 523 so as to face the corresponding pressure generating chambers 521 with the diaphragm 523 therebetween. For example, in Embodiment 2, since the number of rows of the pressure generating chambers 521 is two, the number of rows of the piezoelectric elements 540 is also two.

In Embodiment 2, each piezoelectric element 540 is constituted of a first electrode (electrode layer) 543 disposed on the diaphragm 523, a piezoelectric layer (piezoelectric ceramic layer) 544 independently disposed so as to correspond to each pressure generating chamber 521, and a second electrode (electrode layer) 545 disposed on each piezoelectric layer 544. In the Embodiment, the piezoelectric layer 544 is usually a thick (for example, 10 to 1000 μm) layer made of a piezoelectric material and is a bulk piezoelectric layer formed by, for example, a solid phase reaction in which a powder of a metal oxide or a metal carbonate is physically mixed, pulverized, and molded and then being fired. The first electrode 543 is formed across the piezoelectric layers 544 arranged in parallel and serves as a common electrode of the piezoelectric elements 540 and functions as a part of the diaphragm. The first electrode 543 may be provided to each piezoelectric layer 544.

The layers constituting the actuator unit 520, i.e., the flow path-forming substrate 522, the diaphragm 523, and the pressure generating chamber bottom plate 524 are formed in a unified manner without using adhesives by molding clay ceramic materials, so-called green sheets, into predetermined thicknesses, forming, for example, pressure generating chambers 521 in them, and then laminating them and firing. Then, the piezoelectric elements 540 are formed on the diaphragm 523.

The piezoelectric layer 544 formed on the first electrode 543 has a composition similar to that in Embodiment 1 and is a perovskite-type oxide containing barium titanate, calcium titanate, and europium oxide. Specifically, the piezoelectric layer 544 contains barium titanate as a main component (for example, 90% or more of the entire piezoelectric layer 544) and further contains calcium titanate and europium oxide (for example, 2 to 10% and 0.1 to 5%, respectively, of the entire piezoelectric layer 544). Thus, in Embodiment 2 as in Embodiment 1, since the piezoelectric layer 544 contains barium titanate, calcium titanate, and europium oxide, the piezoelectric elements 300 have high withstand-voltage characteristics and also high displacement characteristics. As a result, the ink jet recording head 510 can be applied to practical use. The details will be described below.

Known lead-free piezoelectric ceramics in which calcium titanate is added to barium titanate are high in withstand-voltage characteristics but low in displacement characteristics and, therefore, cannot be used as the piezoelectric layer of the piezoelectric element that is mounted on an ink jet recoding head. However, in the Embodiment, not only calcium titanate but also europium oxide is added to barium titanate. By further containing europium oxide, the displacement characteristics are improved. In addition, temperature characteristics and durability are satisfactory. In this regard, the details will be described in experimental examples described below.

Furthermore, it is preferable that the piezoelectric layer 544 further contain zirconium oxide as in Embodiment 1. By thus containing zirconium oxide, the displacement characteristics are further improved.

It is preferable that the piezoelectric layer 544 contain barium titanate, calcium titanate, europium oxide, and zirconium oxide in a weight ratio of 0.93 to 0.95:0.05 to 0.07:0.005 to 0.01:0.005 to 0.01, which is represented by the following formula (1):

$$x[BaTiO_3]\text{-}(1-x)[CaTiO_3]\text{-}y[Eu_2O_3]\text{-}z[ZrO_2] \quad (1)$$

(wherein, $0.93 \leq x \leq 0.95$, $0.005 \leq y \leq 0.01$, $0.005 \leq z \leq 0.01$). Note that when zirconium oxide is not contained, z is zero in the formula (1).

Incidentally, the perovskite-type oxide is a compound having a perovskite structure. In the perovskite structure, that is, in the $ABO_3$ structure, twelve oxygen atoms are coordinated to the A-site, and six oxygen atoms are coordinated to the B-site to form an octahedron; and Ba, Ca, and Eu are located at the A-site, and Ti and, according to need, Zr are located at the B-site.

In the invention, by adding small amounts of europium oxide and zirconium oxide to barium titanate serving as the main component, Eu is located at the A-site where Ba is located, and Zr is located at the B-site where Ti is located. Since the ionic radii of Ba and Eu are 149 pm and 95 pm, respectively, Ba and Eu are largely different in their ionic radii. Similarly, the ionic radii of Ti and Zr are 75 pm and 86 pm, respectively, Ti and Zr are largely different in their ionic radii. Therefore, it is assumed that the crystal lattice is deformed by that Eu and Zr are respectively located at the A-site and the B-site of the crystal lattice, and thereby a domain easily rotates, resulting in an improvement in the piezoelectric property (displacement characteristics).

The process of producing the piezoelectric element 540 having such a piezoelectric layer 544 will be described in detail in a latter section.

The flow path unit 530 is composed of an ink supply aperture-forming substrate 531 that is bonded to the pressure generating chamber bottom plate 524 of the actuator unit 520, a reservoir-forming substrate 533 provided with a reservoir 532 that serves as a common ink chamber of a plurality of the pressure generating chambers 521, and a nozzle plate 535 provided with nozzle orifices 534.

The ink supply aperture-forming substrate 531 is a zirconia thin plate with a thickness of 150 μm and is perforated with nozzle-communication holes 536 and ink supply apertures 537. The nozzle-communication holes 536 connect between the nozzle orifices 534 and the pressure generating chambers 521, and the ink supply apertures 537 connect the supply-communication holes 525 and the pressure generating chambers 521 to a corresponding reservoir 532. The ink supply aperture-forming substrate 531 is further provided with ink inlets 538 that communicate with the respective reservoirs 532 and supply ink from an exterior ink tank.

The reservoir-forming substrate 533 is made of a plate material having corrosion resistance suitable for constituting an ink flow path, for example, stainless steel with a thickness of 150 μm and is provided with the reservoirs 532 and the nozzle-communication holes 539. The reservoir 532 receives ink from the exterior ink tank (not shown) and supplies the ink to the pressure generating chambers 521. The nozzle-communication holes 539 connect between the pressure generating chambers 521 and the nozzle orifices 534.

The nozzle plate 535 is made of, for example, a stainless steel thin plate and is perforated with nozzle orifices 534 arranged at the same pitch as that of the pressure generating chambers 521. For example, in the Embodiment, since the flow path unit 530 is provided with two rows of the pressure generating chambers, two rows of the nozzle orifices 534 are formed in the nozzle plate 535. The nozzle plate 535 is bonded to the reservoir-forming substrate 533 on the side opposite to the flow path-forming substrate 522 and seals one side of the reservoir 532.

The flow path unit 530 is formed by fixing the ink supply aperture-forming substrate 531, the reservoir-forming substrate 533, and the nozzle plate 535 with, for example, an adhesive or a thermal adhesive film. In Embodiment 2, the reservoir-forming substrate 533 and the nozzle plate 535 are made of stainless steel, but the flow path unit 530 may be made of, for example, ceramics in a unified manner as in the actuator unit 520.

Then, the flow path unit 530 and the actuator unit 520 are bonded and fixed to each other with, for example, an adhesive or a thermal adhesive film.

Furthermore, as shown in FIG. 8, terminal portions 546 communicating with the piezoelectric elements 540 are each provided in an area facing the peripheral wall of each pressure generating chamber 521 at one end in the longitudinal direction of each piezoelectric element 540. The terminal portions 546 are provided to the respective piezoelectric elements 540 and are conductively coupled to second electrodes 545 of the piezoelectric elements 540. Terminal portions (not shown) that are conducted to the first electrode 543 drawn out to both end sides in the parallel direction of the piezoelectric elements and the terminal portions 546 are arranged in parallel in the arrangement direction of the piezoelectric elements 540. In Embodiment 2, two rows of the terminal portions 546 are arranged in parallel between the rows of the piezoelectric elements 540 arranged in parallel.

The terminal portion 546 is configured so that the height from the flow path-forming substrate 522 (diaphragm 523), i.e., the upper end face is higher than the height of the piezoelectric element 540 from the flow path-forming substrate 522 (diaphragm 523). By doing so, when the terminal portion 546 is connected to the wiring layer of the wiring board 550, the wiring board 550 does not abut against the piezoelectric element 540, and thereby a decrease in displacement of the piezoelectric element 540 can be prevented. In Embodiment 2, the height of the terminal portion 546 from the flow path-forming substrate 522 (diaphragm 523) is designed to be 20 μm.

The terminal portion 546 can be formed by, for example, screen-printing a highly conductive metal material such as silver (Ag).

Furthermore, the terminal portion that is conductively coupled to each second electrode 545 and first electrode 543 of the piezoelectric element 540 is electrically connected to the wiring layer 551 provided to the wiring board 550, and thereby a driving signal from a driving circuit (not shown) is supplied to each piezoelectric element 540 via the wiring board 550. The driving circuit is not shown in the drawing, but may be mounted on the wiring board 550 or may be mounted on a component other than the wiring board 550.

The wiring board 550 is formed of, for example, one flexible printing circuit (FPC) or one tape carrier package (TCP) provided across the two rows of the piezoelectric elements 540. Specifically, the wiring board 550 is formed, for example, by that a wiring layer 551 having a predetermined pattern is formed on a surface of a base film 552 made of polyimide or the like by subjecting the surface to, for example, tin plating using a copper thin film as a base, and the wiring layer 551 is covered with an insulating material 553 such as resist at the area other than the end that is connected to the terminal portion 546.

The wiring board 550 is provided with a through-hole 554 in an area between the rows of the piezoelectric elements 540 arranged in parallel. The wiring layer 551 is connected to the terminal portion 546 at the end on the through-hole 554 side. A wiring layer 551 that is connected to the piezoelectric elements 540 in one row and a wiring layer 551 that is connected to the piezoelectric elements 540 in the other row are formed on a surface of a base film 552 that is not yet provided with the through-hole 554 so that the wiring layers 551 are continuous, and then the through-hole 554 of the wiring board 550 is formed in the base film 552 so that the conductively coupled wiring layers 551 that are connected to the two rows of the piezoelectric elements 540 are divided.

Then, the wiring layer 551 of the wiring board 550 and the terminal portion conductively coupled to the piezoelectric element 540 are connected electrically and mechanically via an adhesive layer 555 made of an anisotropic conductive material.

In the ink jet recoding head 510 with such a configuration, ink is fed into the reservoir 532 from an ink cartridge (storage means) through the ink inlet 538 to fill the liquid flow path from the reservoir 532 to the nozzle orifices 534 with the ink. Then, a recording signal from a driving circuit (not shown) is supplied to each piezoelectric element 540 through the wiring board 550 to apply a voltage to the piezoelectric element 540 corresponding to each pressure generating chamber 521 and thereby flexurally deform the piezoelectric element 540 and also the diaphragm 523. As a result, the pressure in each pressure generating chamber 521 is increased to eject ink droplets from each nozzle orifice 534.

An example of a process of producing the ink jet recoding head of Embodiment 2 will be described, but the steps other than the step of producing the piezoelectric element are similar to or the same as those in Embodiment 1, and therefore the descriptions thereof are omitted.

First, as starting materials of main components for obtaining the piezoelectric layer 544, for example, powders of $BaCO_3$, $TiO_2$, $Eu_2O_3$, and, according to need, $ZrO_2$ are prepared. These powders in dried states are weighed at a predetermined ratio and then are mixed and pulverized, for example, in a ball mill containing pure water or ethanol to give a raw material mixture. Subsequently, the raw material mixture is dried and then synthesized (calcined), for example, at 900 to 1100° C. when powders of $BaCO_3$, $TiO_2$, and $Eu_2O_3$ are used and at 1000 to 1200° C. when powders of $BaCO_3$, $TiO_2$, $Eu_2O_3$, and $ZrO_2$ are used to form a powder containing $BaTiO_2$, $Eu_2O_2$, and $ZrO_2$.

Then, a $CaTiO_2$ solution (sol) is added to the resulting powder, and the mixture is mixed, for example, in a ball mill. The resulting mixture is dried and then degreased at about 400 to 600° C. when powders of $BaCO_2$, $TiO_2$, and $Eu_2O_2$ are used and at about 600 to 700° C. when powders of $BaCO_2$, $TiO_2$, $Eu_2O_2$, and $ZrO_2$ are used. Subsequently, degreased mixture is pulverized into a powder. A predetermined amount of a binder is added to the resulting powder, followed by granulation and molding at a predetermined pressure (for example, 1000 to 2000 kg/cm$^2$) by die pressing. The molded product is sintered at a temperature of about 1000 to 1400° C. to form a so-called bulk piezoelectric material consisting of $BaTiO_2$—$CaTiO_2$—$Eu_2O_2$ or $BaTiO_3$—$CaTiO_3$—$Eu_2O_3$—$ZrO_2$.

Then, the piezoelectric material is ground, and a first electrode 543 and a second electrode 545 are formed on both surfaces thereof. Then, through polling and various types of measurements, the piezoelectric elements 540 are formed. The resulting piezoelectric elements 540 are mounted on a flow path-forming substrate 522 to give an ink jet recoding head of the Embodiment. That is, by thus forming the piezoelectric elements 540, an ink jet recoding head that is environment friendly and can satisfactorily eject ink droplets regardless of a change in temperature can be achieved.

In particular, in Embodiment 2, a calcium titanate solution is added to a powder containing barium titanate, europium oxide, and, according to need, $ZrO_2$. That is, both solid phase reaction and liquid phase reaction are employed so that a calcium titanate solution is added during a process of producing a piezoelectric material. By doing so, the withstand-voltage characteristics and the piezoelectric property of the piezoelectric layer 544 can be further certainly improved. However, calcium titanate may be added in its powder state as a starting material.

The displacement characteristics and other characteristics of the thus produced piezoelectric layer 544 will be described in detail with reference to the following experimental examples.

Sample 1

An aqueous solution of 7% by weight of polyvinyl alcohol (PVA) was added to a $BaTiO_3$ powder, followed by granulation and then molding at a pressure of 1500 kg/cm$^2$ by die pressing. The molded product was sintered at 1350° C. for 4 hours to obtain Sample 1. The resulting Sample 1 was a piezoelectric layer represented by the above-mentioned formula (1) with values of x, y, and z shown in Table 1.

Sample 2

Powders of $BaCO_3$ and $TiO_2$ in dried states were weighed, and ethanol and other components were added thereto, followed by mixing and pulverizing in a ball mill to give a raw material mixture. Then, the raw material mixture was dried and calcined at 1000° C. to form a powder of $BaTiO_3$.

Then, a $CaTiO_3$ solution (sol) was added to the resulting $BaTiO_3$ powder so that a mixture ratio (weight ratio) of $BaTiO_3$ and $CaTiO_3$ is 95:5, followed by mixing. The resulting mixture was degreased at 650° C. for 1 hour. Subsequently, the degreased mixture was pulverized to a powder. As in Sample 1, an aqueous solution of 7% by weight of PVA was added to the resulting powder, followed by granulation and then molding at a pressure of 1500 kg/cm$^2$ by die pressing. The molded product was sintered at 1350° C. for 4 hours to obtain Sample 2. The resulting Sample 2 was a piezoelectric layer represented by the above-mentioned formula (1) with values of x, y, and z shown in Table 1.

Sample 3

The same procedure as in Sample 2 was conducted except that the mixture ratio (weight ratio) of $BaTiO_3$ and $CaTiO_3$ was 93:7 instead of 95:5.

Sample 4

The same procedure as in Sample 3 was conducted except that a raw material mixture prepared by weighing powders of $BaCO_3$, $TiO_2$, and $Eu_2O_3$ in dried states so that the weight ratio of $Eu_2O_3$ relative to the total amount of $BaTiO_3$ and $CaTiO_3$ was 0.5% and then mixing and pulverizing the powders in a ball mill containing ethanol and other components and that the sintering temperature was 1300° C.

Sample 5

The same procedure as in Sample 4 was conducted except that the weight ratio of $Eu_2O_3$ relative to the total amount of $BaTiO_3$ and $CaTiO_3$ was 1%.

Sample 6

The same procedure as in Sample 4 was conducted except that a raw material mixture prepared by weighing powders of $BaCO_3$, $TiO_2$, $Eu_2O_3$, and $ZrO_2$ in dried states so that the weight ratios of $Eu_2O_3$ and $ZrO_2$ relative to the total amount of $BaTiO_3$ and $CaTiO_3$ were each 0.5% and then mixing and pulverizing the powders in a ball mill containing ethanol and other components and that the sintering temperature was 1350° C.

Sample 7

The same procedure as in Sample 6 was conducted except that the weight ratio of $ZrO_2$ relative to the total amount of $BaTiO_3$ and $CaTiO_3$ was 1% and that the sintering temperature was 1400° C.

Sample 8

The same procedure as in Sample 5 was conducted except that a raw material mixture prepared by weighing powders of $BaCO_3$, $TiO_2$, $Eu_2O_3$, and $ZrO_2$ in dried states so that the weight ratios of $Eu_2O_3$ and $ZrO_2$ relative to the total amount of $BaTiO_3$ and $CaTiO_3$ were 1% and 0.5%, respectively, and then mixing and pulverizing the powders in a ball mill containing ethanol and other components and that the sintering temperature was 1400° C.

Test Example

Figure 9:
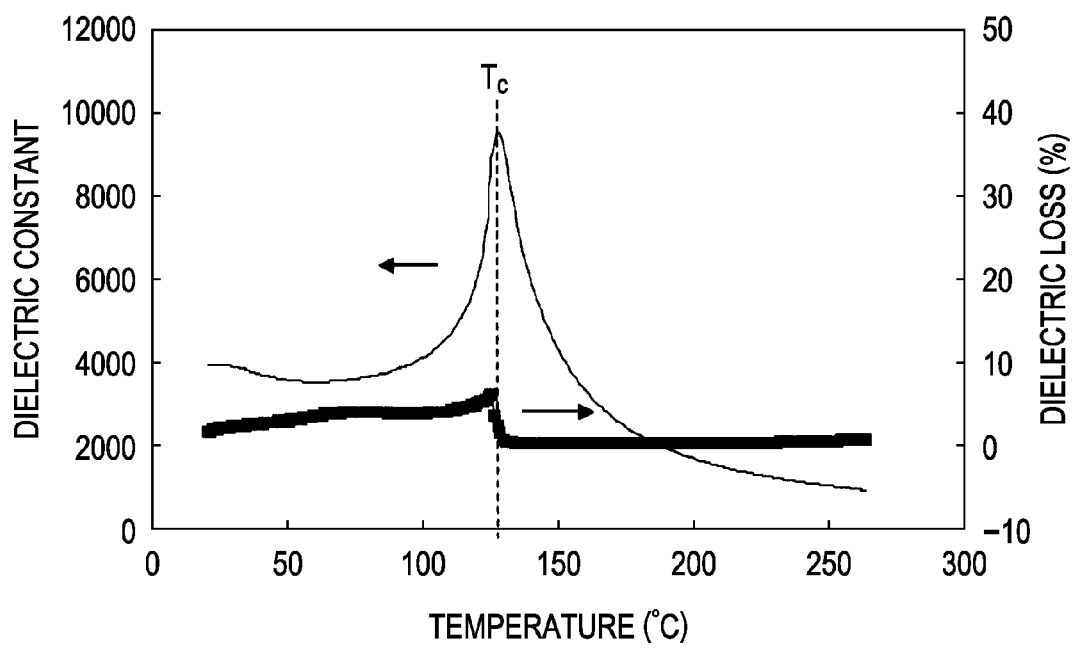
FIG. 9 is a graph showing a relationship between temperature and dielectric constant in Sample 1.

The thus formed Samples 1 to 8 were each measured for piezoelectric constant $d_{33}$ (displacement characteristics) in the polarization direction, dielectric loss (tan δ), density, phase transition temperature (To-t) of the crystalline state and Curie temperature (Tc). The results are shown in Table 1 and drawings. Here, the $d_{33}$ was measured with a piezo $d_{33}$ meter, a product of UK PIEZOTEST, the tan δ was measured with HP4294A, a product of Hewlett-Packard, and the density was measured by an Archimedes' method. The phase transition temperature was determined by measuring dielectric constant ∈r with an automatic-recording dielectric constant measurement system (LCR meter) while varying the temperature. The some measurement results showing the relationship between dielectric constant and temperature are shown in FIG. 9 (Sample 1), FIG. 10 (Sample 3), and FIG. 11 (Sample 6).

The results show that Samples 2 and 3 containing $CaTiO_3$ in $BaTiO_3$ each had a significantly low $d_{33}$ value compared to that of Sample 1 containing only $BaTiO_3$ and that the values of Samples 4 and 5 further containing $Eu_2O_3$ were 209 pC/N and 182 pC/N, respectively. Therefore, it was confirmed that displacement characteristics are improved by further adding $Eu_2O_3$.

Furthermore, the displacement characteristics of Samples 6 to 8 further containing $ZrO_2$, in addition to $BaTiO_3$, $CaTiO_3$, and $Eu_2O_3$ were further improved compared to Samples 4 and 5 not containing $ZrO_2$. Specifically, the $d_{33}$ value of Sample 6 was improved by about 10% compared to that of Sample 4 having the same composition ratio as that of Sample 6 except that $ZrO_2$ is not contained. Similarly, the $d_{33}$ value of Sample 8 was improved by about 10% compared to that of Sample 5 having the same composition ratio as that of Sample 8 except that $ZrO_2$ is not contained. Incidentally, the values of $d_{33}$ of Samples 7 and 8 look slightly small. This is because their densities are nearly 10% smaller than those of Samples 1 to 6. The values $d_{33}$ thereof become approximately the same as that of Sample 6 by adjusting the densities to a similar level to those of Samples 1 to 6 by, for example, lengthening the firing time.

Figure 10:
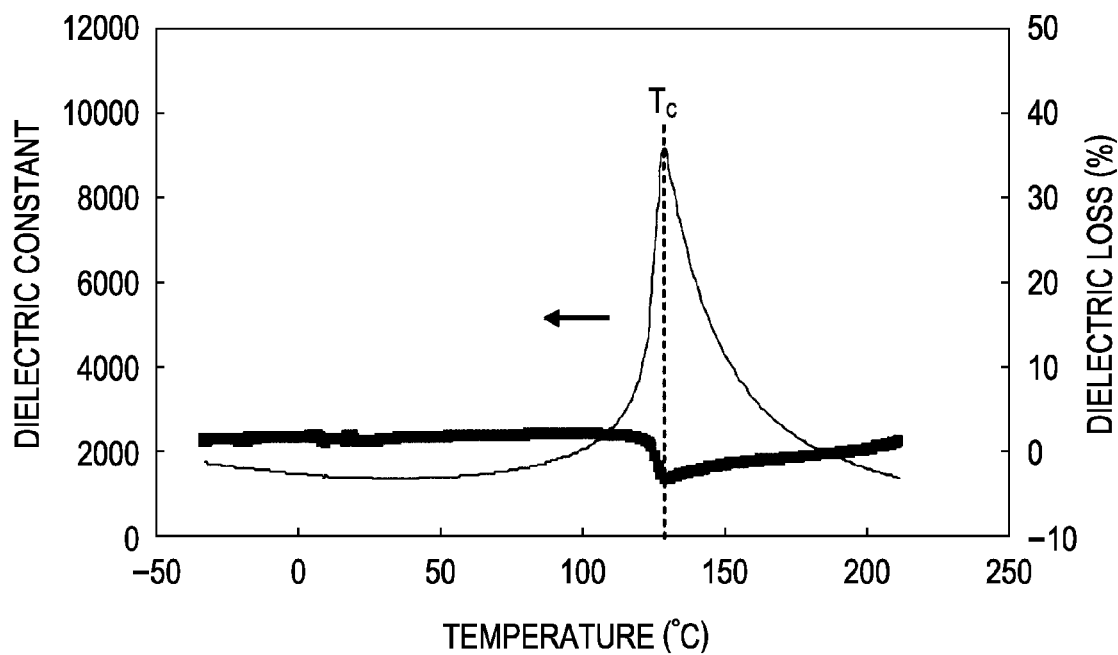
FIG. 10 is a graph showing a relationship between temperature and dielectric constant in Sample 3.
Figure 11:
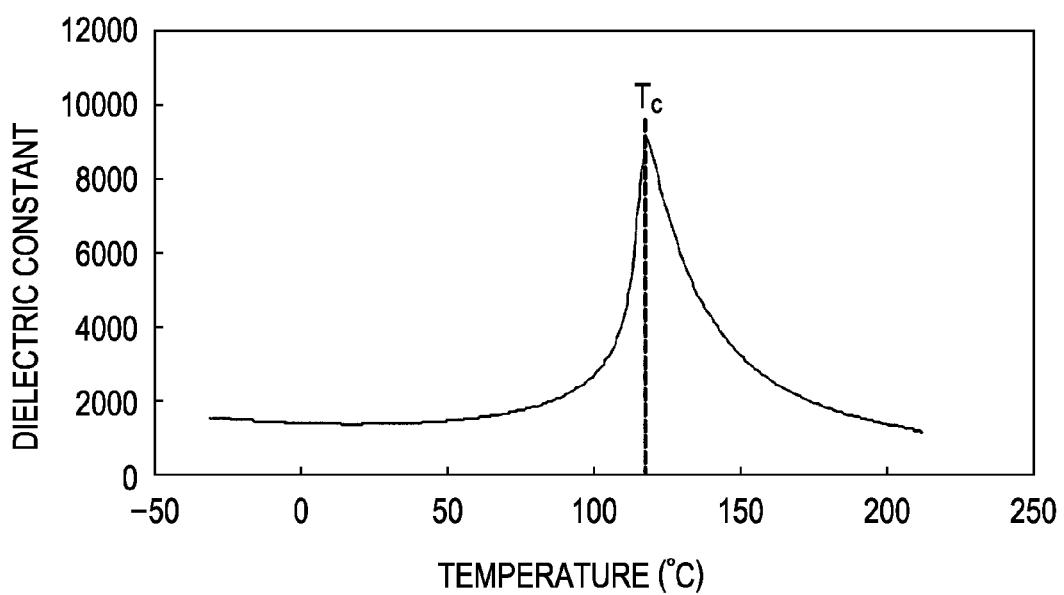
FIG. 11 is a graph showing a relationship between temperature and dielectric constant in Sample 6.

In addition, the temperature characteristics were improved. Specifically, as shown in FIGS. 9 to 11, the system of $BaTiO_3$ and the systems containing $CaTiO_3$, $Eu_2O_3$, and $ZrO_2$ in $BaTiO_3$ were hardly different in the Curie temperature Tc. On the other hand, as shown in Table 1 and FIGS. 9 to 11, the phase transition temperature (To-t) of the crystalline state, specifically, the temperature at which phase transition occurs from an orthorhombic crystal to a tetragonal crystal, is observed as a peak in dielectric constant measurement, and in Sample 1 (FIG. 9), the To-t peak was observed at room temperature (approximately 19° C.). However, in Samples 2 to 7, no To-t peaks were observed even at approximately −30° C. Therefore, it was confirmed that the To-t levels of Samples 2 to 7 were lower than −30° C. Here, as shown in FIGS. 9 to 11, the characteristics such as the dielectric constant were not affected by temperature in the temperature range between Tc and To-t. Therefore, in Samples 1 to 7 having approximately the same Tc levels, the characteristics of Samples 2 to 7 having low To-t levels were hardly affected by temperature. Thus, it was confirmed that Samples 2 to 7 were piezoelectric layers having satisfactory temperature characteristics.

In addition, Samples 2 to 7 each had a sufficiently low dielectric loss (tan δ) and were therefore excellent in durability.

Figure 12:
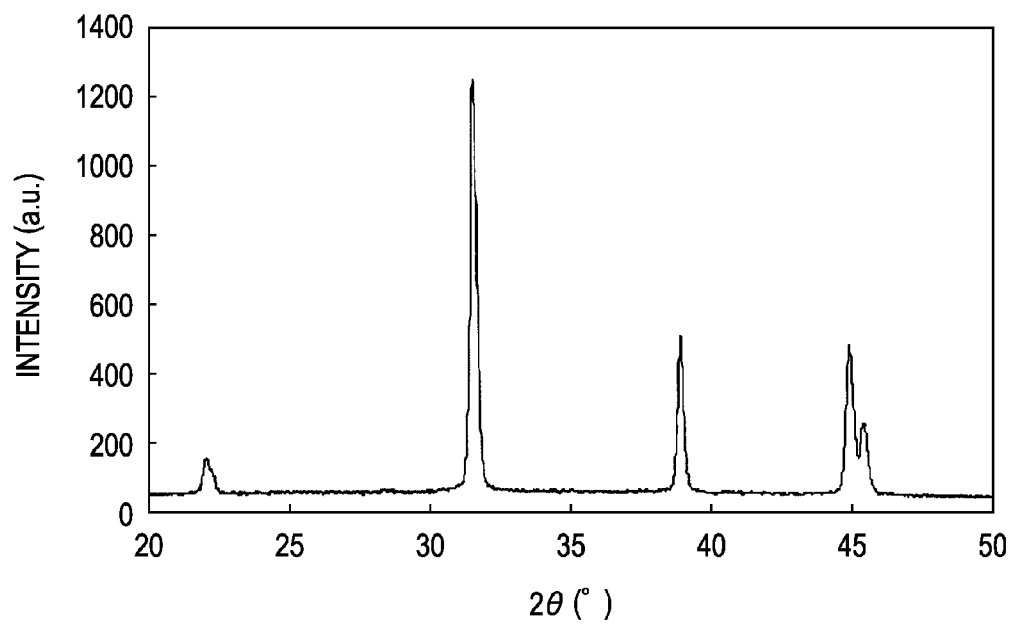
FIG. 12 is a graph showing an X-ray diffraction pattern of Sample 1.
Figure 13:
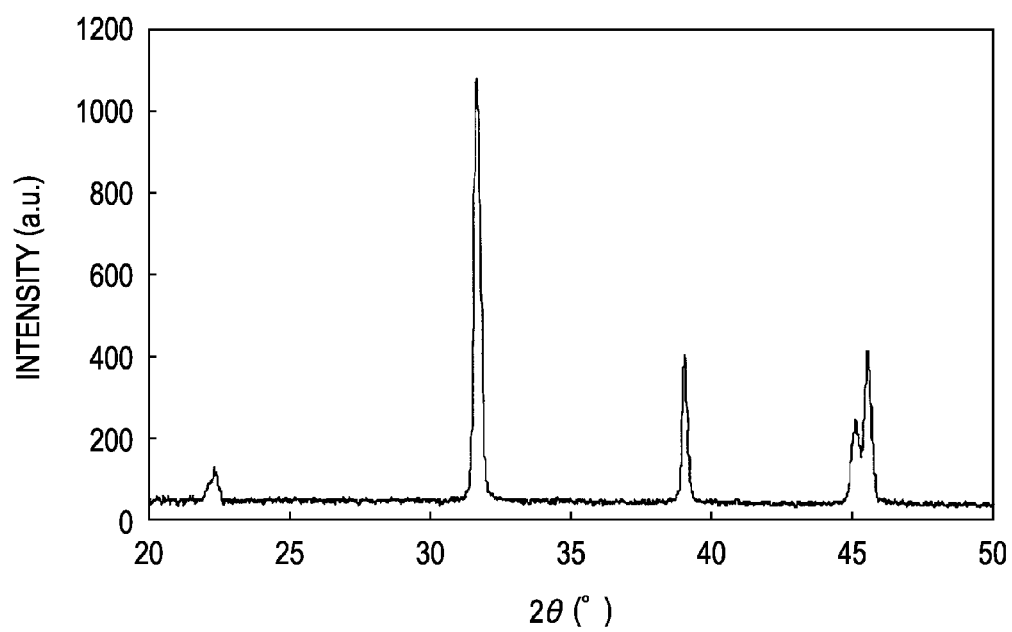
FIG. 13 is a graph showing an X-ray diffraction pattern of Sample 6.

X-ray diffraction patterns of powders of Samples 1 to 8 were obtained with "D8 Discover", a product of Bruker AXS, using CuKα-ray as a X-ray source at room temperature. FIG. 12 (Sample 1) and FIG. 13 (Sample 6) show some of the results. As shown in the results, in all Samples 1 to 7, $ABO_3$ structures were formed, and no peaks caused by other different phases were observed.

TABLE 1

|  | x | y | z | Density (g/cm³) | tan δ (%) | $d_{33}$ (pC/N) | To-t (° C.) |
| --- | --- | --- | --- | --- | --- | --- | --- |
| Sample 1 | 1.0 | 0 | 0 | 5.9 | 4.0 | 253 | 19 |
| Sample 2 | 0.95 | 0 | 0 | 5.79 | 1.2 | 179 | <−30 |
| Sample 3 | 0.93 | 0 | 0 | 5.75 | 0.9 | 152 | <−30 |
| Sample 4 | 0.93 | 0.005 | 0 | 5.72 | 1.1 | 209 | <−30 |
| Sample 5 | 0.93 | 0.01 | 0 | 5.77 | 1.44 | 182 | <−30 |
| Sample 6 | 0.93 | 0.005 | 0.005 | 5.7 | 1.0 | 229 | <−30 |
| Sample 7 | 0.93 | 0.005 | 0.01 | 5.32 | 1.7 | 202 | <−30 |
| Sample 8 | 0.93 | 0.01 | 0.005 | 5.38 | 1.5 | 196 | <−30 |

Other Embodiments

In the previous description the invention is described with reference to Embodiments 1 and 2, but the basic constitution of the invention is not limited thereto. For example, the piezoelectric layer 70 in Embodiment 1 is produced by a chemical solution method such as a sol-gel method or MOD in which a piezoelectric precursor film formed by application of a piezoelectric precursor solution is crystallized by heating or a gas phase method such as sputtering, but may be a bulk piezoelectric layer formed by a solid phase reaction as the piezoelectric layer 544 of Embodiment 2. The piezoelectric layer 544 of Embodiment 2 may be a piezoelectric layer formed by a chemical solution method or a gas phase method as the piezoelectric layer 70 of Embodiment 1.

Furthermore, in the above-described Embodiment 1 and 2, the flow path-forming substrate 10 is a single-crystal silicon substrate or a ceramic plate, but is not limited thereto and may be, for example, an SOI substrate or a glass substrate.

In addition, in the above-described Embodiment 1 and 2, the piezoelectric element is formed by sequentially laminating a first electrode, a piezoelectric layer, and a second electrode on a substrate, but is not limited thereto. The invention can be applied to, for example, a longitudinal vibration-type piezoelectric element that extends and contracts in the axial direction by alternately laminating a piezoelectric material and an electrode-forming material.

Figure 14:
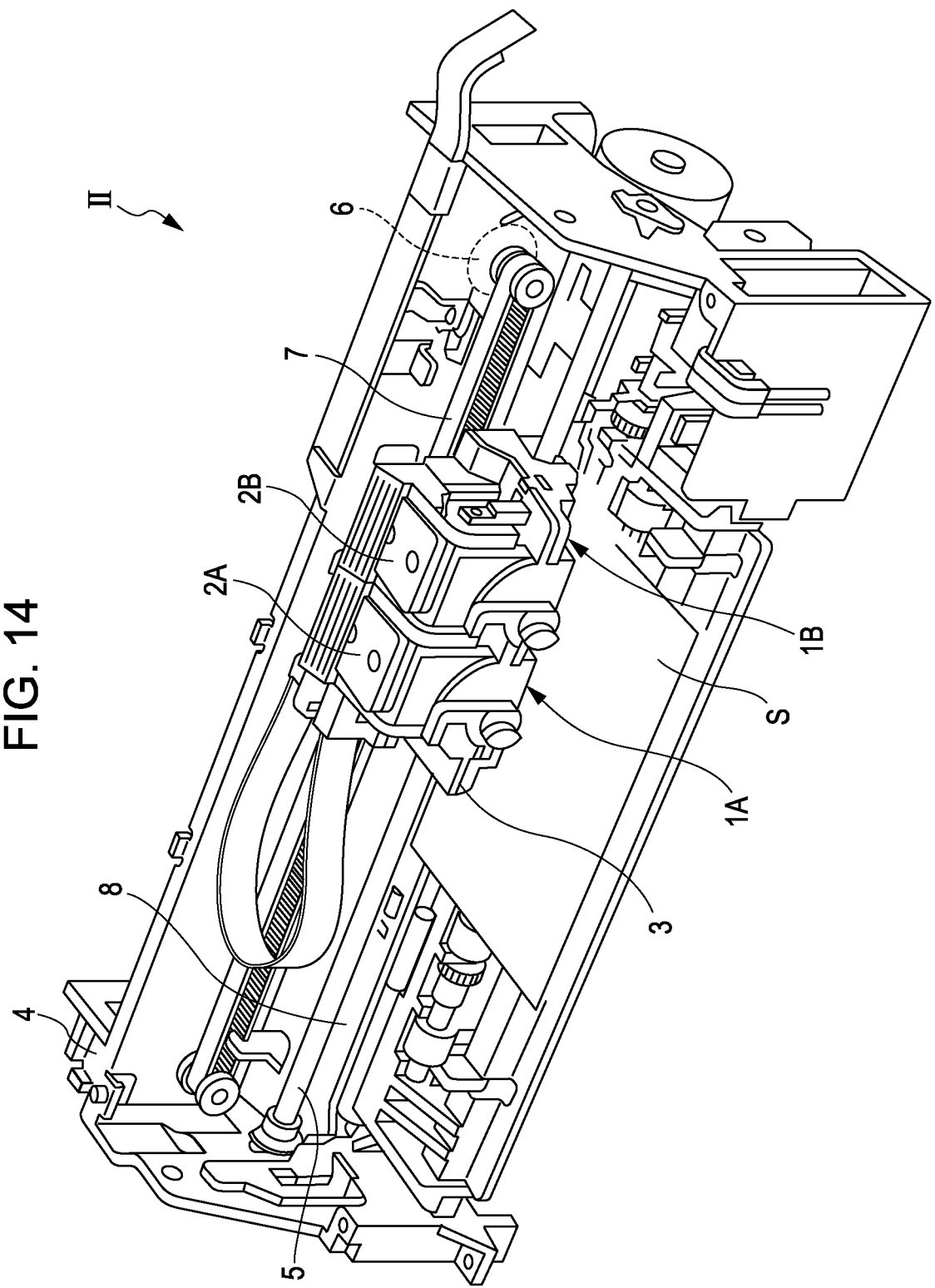
FIG. 14 is a perspective view of a liquid ejecting apparatus according to another embodiment.

The ink jet recording heads of these Embodiments each constitutes a part of a recording head unit including an ink flow path that communicates with, for example, an ink cartridge and is mounted on an ink jet recording apparatus. FIG. 14 is a schematic view showing an example of such an ink jet recording apparatus.

In the ink jet ejecting apparatus II shown in FIG. 14, the recording head units 1A and 1B including the ink jet recording heads I are detachably provided with cartridges 2A and 2B constituting ink supplying means. The recording head units 1A and 1B are mounted on a carriage 3. The carriage 3 is set to a carriage axis 5 that is fixed to an apparatus body 4 in a manner that the carriage 3 is movable in the axial direction. The recording head units 1A and 1B discharge, for example, a black ink composition and a color ink composition, respectively.

Driving force of a driving motor 6 is transferred to the carriage 3 through a plurality of gears (not shown) and a timing belt 7, and thereby the carriage 3, on which the recording head units 1A and 1B are mounted, is moved along the carriage axis 5. The apparatus body 4 is provided with a platen 8 along the carriage axis 5, and a recording sheet S, serving as a recording medium such as paper, is fed by, for example, a feeding roller (not shown) and is wrapped around the platen 8 and thereby transported.

In the above-described embodiments, the ink jet recording heads have been described as examples of the liquid ejecting head, but the present invention broadly covers general liquid ejecting heads and also can be applied to liquid ejecting heads that eject liquid other than ink. Examples of the other liquid ejecting heads include recording heads used in image recording apparatuses such as printers, coloring material ejecting heads used for producing color filters of, for example, liquid crystal displays, electrode material ejecting heads used for forming electrodes of, for example, organic EL displays or field emission displays (FEDs), and bio-organic material ejecting heads used for producing bio-chips.

Furthermore, the invention is not limited to piezoelectric actuators used in liquid ejecting heads represented by ink jet recording heads and can be applied to other piezoelectric elements, for example, ultrasonic devices such as ultrasonic transmitters, pressure sensors, and ultrasonic motors.

What is claimed is:

1. A liquid ejecting head comprising a pressure generating chamber communicating with a nozzle for ejecting liquid droplets and a piezoelectric element having a piezoelectric layer and a pair of electrodes disposed on either side of the piezoelectric layer, wherein the piezoelectric layer is made of a perovskite-type oxide containing barium titanate, calcium titanate, europium oxide, and zirconium oxide, wherein the piezoelectric layer is made of a perovskite-type oxide represented by the following Formula (1):

$$x[BaTiO_3]\text{-}(1-x)[CaTiO_3]\text{-}y[Eu_2O_3]\text{-}z[ZrO_2] \quad (1)$$

(wherein, $0.93 \leq x \leq 0.95$, $0.005 \leq y \leq 0.01$, $0.005 \leq z \leq 0.01$).

2. The liquid ejecting head according to claim 1, wherein the piezoelectric layer further contains potassium.

3. The liquid ejecting head according to claim 1, wherein the piezoelectric layer further contains silicon.

4. A liquid ejecting apparatus comprising a liquid ejecting head according to claim 1.

5. A piezoelectric element comprising a piezoelectric layer and a pair of electrodes disposed on either side of the piezoelectric layer, wherein the piezoelectric layer is made of a perovskite-type oxide containing barium titanate, calcium titanate, europium oxide, and zirconium oxide, wherein the piezoelectric layer is made of a perovskite-type oxide represented by the following Formula (1):

$$x[BaTiO_3]\text{-}(1-x)[CaTiO_3]\text{-}y[Eu_2O_3]\text{-}z[ZrO_2] \quad (1)$$

(wherein, $0.93 \leq x \leq 0.95$, $0.005 \leq y \leq 0.01$, $0.005 \leq z \leq 0.01$).

6. The piezoelectric element according to claim 5, wherein the piezoelectric layer further contains potassium.

7. The piezoelectric element according to claim 5, wherein the piezoelectric layer further contains silicon.

8. A liquid ejecting apparatus comprising:
a liquid supply for storing liquid; and
a liquid ejecting head including:
    a pressure generating chamber communicating with the liquid supply and a nozzle for ejecting liquid droplets; and
    a piezoelectric element having a piezoelectric layer and a pair of electrodes disposed on either side of the piezoelectric layer,
wherein the piezoelectric layer is made of a perovskite-type oxide containing barium titanate, calcium titanate, europium oxide, and zirconium oxide represented by the following Formula (1):

$$x[BaTiO_3]\text{-}(1-x)[CaTiO_3]\text{-}y[Eu_2O_3]\text{-}z[ZrO_2] \quad (1)$$

(wherein, $0.93 \leq x \leq 0.95$, $0.005 \leq y \leq 0.01$, $0.005 \leq z \leq 0.01$).

9. The liquid ejecting apparatus according to claim 8, wherein the piezoelectric layer further contains potassium.

10. The liquid ejecting head apparatus according to claim 8, wherein the piezoelectric layer further contains silicon.

* * * * *